United States Patent [19]
Chen et al.

[11] Patent Number: 5,561,624
[45] Date of Patent: Oct. 1, 1996

[54] READ-ONLY-MEMORY ARRAY WITH CODING AFTER METALLIZATION

[75] Inventors: Hsin-Li Chen, Hsinchu; Te-Sun Wu, Hsinchu-Hsien; Kai-Chi Hsieh, Hsinchu, all of Taiwan

[73] Assignee: United Microelectronics Corp., Hsinchu, Taiwan

[21] Appl. No.: 495,761

[22] Filed: Jun. 26, 1995

[51] Int. Cl.$^6$ .................................................. G11C 17/00
[52] U.S. Cl. ..................... 365/104; 365/185.17; 365/72; 365/94; 257/390
[58] Field of Search .................... 365/104, 94, 103, 365/72, 178, 189.01, 185.17; 257/390, 391

[56] References Cited

U.S. PATENT DOCUMENTS

| | | | |
|---|---|---|---|
| 5,260,894 | 11/1993 | Noda | 365/104 |
| 5,295,092 | 3/1994 | Hotta | 365/104 |
| 5,383,149 | 1/1995 | Hong | 257/390 |

*Primary Examiner*—Tan T. Nguyen
*Attorney, Agent, or Firm*—Cushman Darby & Cushman, L.L.P.

[57] ABSTRACT

A ROM array with coding after metallization comprises a plurality of first bit lines, a plurality of second bit lines, a plurality of third bit lines, a plurality of word lines, a plurality of first control lines, a plurality of second control lines and a plurality of selecting lines. Memory cells of the ROM array are formed by the intersection of the word lines and the first and second bit lines, wherein the word lines are polysilicon gates and the bit lines are drain/source diffusion regions. The third bit lines are metal lines above the first bit lines. The third bit lines are not wide enough to cover spacings between the first and second bit lines, thus exposing spaces for code implantation. The first and second control lines intersect the first and second bit lines to form a number of switches for controlling data reading paths to The memory cells. The positions and ON/OFF states of the switches are designed to provide at least two data reading paths to each memory cell. Thus, the sensing currents in the bit lines are increased and become more uniform.

8 Claims, 8 Drawing Sheets

5,561,624

1

READ-ONLY-MEMORY ARRAY WITH CODING AFTER METALLIZATION

BACKGROUND OF THE INVENTION

1. Field of Invention

The present invention relates to read-only-memory (ROM) devices, and more particularly, to a ROM array in which the coding step is performed after the metallization step.

2. Description of Related Art

In general, a ROM device is programmed in a code implantation step. The code implantation step, especially for a mask ROM device, is carried out prior to depositing a metal layer to cover the device. Therefore, some post-processing of the ROM device is necessary after the code implantation step. Since the post-processing processes, such as passivation formation, contact opening, metallization, packaging and testing take a lot of time, ROM devices cannot be produced soon after they are ordered. Thus, a coding after metallization technique has been developed to speed up the production of the ROM devices.

For example, in order to provide better conditions for coding after metallization and still follow the design rules, the layout configuration of a high-density mask ROM array, such as the flat-cell memory array, has to be arranged carefully. FIG. 1 (Prior Art) is a schematic diagram illustrating a conventional layout configuration of a ROM array, in which only one bank is shown. A plurality of bit lines 1 through 8 are made of diffusion regions. A plurality of word lines $WL_1$ through $WL_n$ intersect the bit lines to form memory cells. For example, bit lines 6 and 7 construct the drain/source regions of cell M61, while word line WL1 is the gate. Therefore, spacings between bit lines become the channel regions of the memory cells. A number of metal lines 11 through 14 are formed between the bit lines for reading data stored in the memory cells. Thus, metal contacts with bit lines 1 through 8 are formed on opposite sides of the bank. In order to program the ROM array, impurities are implanted into the channel regions of specific memory cells, i.e., the spacings between the bit lines, in the code implantation step. Since metal lines 11 through 14 are usually formed after the code implantation step, the fact that the spacings between bit lines are covered by the metal lines does not affect the programming of the ROM array. However, if the code implantation step is to be carried out after the metallization step, the location of metal lines 11 through 14 must be modified.

A layout configuration for coding after metallization ROM array has been developed by modifying the structure of FIG. 1 (Prior Art), as illustrated in FIG. 2 (Prior Art). As is shown in FIG. 2 (Prior Art), metal lines 11 through 14 are formed over bit lines 2, 4, 6 and 8 to expose the substrate surface of the spacings between bit lines 1 through 8. Therefore, impurities can be easily implanted into the channel regions of the memory cells in the code implantation step. Referring to FIG. 3A, the coding of three memory cells of the ROM array is carried out by implanting ions into channel regions 21, 22 and 23 through an implanting mask as indicated by the dashed line. However, as the size of semiconductor devices decreases, the design rules become critical. Therefore, the implanting mask of FIG. 3A must be modified to the configuration of FIG. 3B. That is, the originally distinct implanting regions 21, 22 and 23 are merged into a single area indicated by the dashed line. Since bit lines 25, 26 and 27 are also diffusion regions, the broadening of the code implanting region will change the impurity concentrations in the bit lines and thus vary the conductivities.

The variation of the bit line conductivity will affect the data precision accessed over the metal lines. This effect will be explained. FIG. 4 (Prior Art) is a circuit diagram of the ROM array whose layout configuration is shown in FIG. 2 (Prior Art). In the ROM array, except for two memory cells $M_{41}$ and $M_{4n}$, all the memory cells are coded by implanting impurities into their channel regions. Therefore, all bit lines that are not covered by the metal lines also have impurities implanted into them. Since the sheet resistance of a diffusion region depends on the concentration of impurities therein, the code implantation will increase the sheet resistance of the bit lines which are implanted. In general, the ratio between original and implanted bit lines is about 120:180. That is, if the sheet resistance of the implanted bit lines is designated as $R_1$ and that of the original bit lines is designated as $R_2$, there is the relationship that $R_1/R_2 \approx 3/2$. Since the ratio is not unity, a problem of data precision may result.

The problem can be better understood through a description of the data reading paths to cells $M_{41}$ and $M_{4n}$ which are illustrated in FIG. 5A (Prior Art) and FIG. 5B (Prior Art) respectively. Referring to FIG. 5A (Prior Art), the reading path to cell $M_{41}$ includes a transistor $BSO_3$, cell $M_{41}$, bit line 4 and another transistor $BSE_2$. Since bit line 4 is shielded by a metal line as shown in FIG. 2 (Prior Art), it has a sheet resistance of $R_2$. Therefore, the resistance of bit line 4 can be represented as $R=30R_2K$, where K is the line width. As for cell $M_{4n}$, the reading path includes transistor $BSO_3$, bit line 5, cell $M_{4n}$ and transistor $BSE_2$. As shown in FIG. 2 (Prior Art), bit line 5 is exposed and has been implanted with impurities after the coding step. Therefore, the resistance of bit line 5 is represented as $R=30R_1K$. Since $R_1/R_2 \approx 3/2$, sensing currents in bit lines 4 and 5 will have a ratio of about 2/3. It is difficult to design a sense amplifier to read sensing currents with such a wide variation, and thus it is impossible to obtain data with a high degree of precision.

SUMMARY OF THE INVENTION

To prevent such a wide sensing current variation, the present invention provides a ROM array structure for utilizing the technique of coding after metallization to eliminate the variation in the bit line resistance, and thus maintaining the uniformity of sensing currents and increasing the data precision.

The present invention also provides a ROM array structure to decrease effective bit line resistance, thus increasing the sensing currents and facilitating data sensing by the sense amplifier.

Each bank structure of the ROM array according to the present invention comprises a plurality of first bit lines, a plurality of second bit lines, a plurality of third bit lines, a plurality of word lines, a plurality of first control lines, a plurality of second control lines and a plurality of selecting lines. Memory cells of the ROM array are formed by the intersection of the word lines and the first and second bit lines, wherein the word lines are polysilicon gates and the bit lines are drain/source are created from diffusion regions. The third bit lines are metal lines layered on top of the first bit lines, thus exposing spaces for code implantation. The first and second control lines intersect the first and second bit lines to form a number of switches for controlling the data reading paths from the memory cells. The positions and ON/OFF states of the switches are designed to provide at least two data reading paths to each memory cell. Thus, the sensing currents in the bit lines are increased and become more uniform. This uniformity increases the accuracy of the circuit.

BRIEF DESCRIPTION OF THE DRAWINGS

The above features of the present invention will become more apparent by reference to the following descriptions in connection with the accompanying drawings, wherein.

DETAILED DESCRIPTION OF THE PREFERRED EMBODIMENTS

Figure 1:
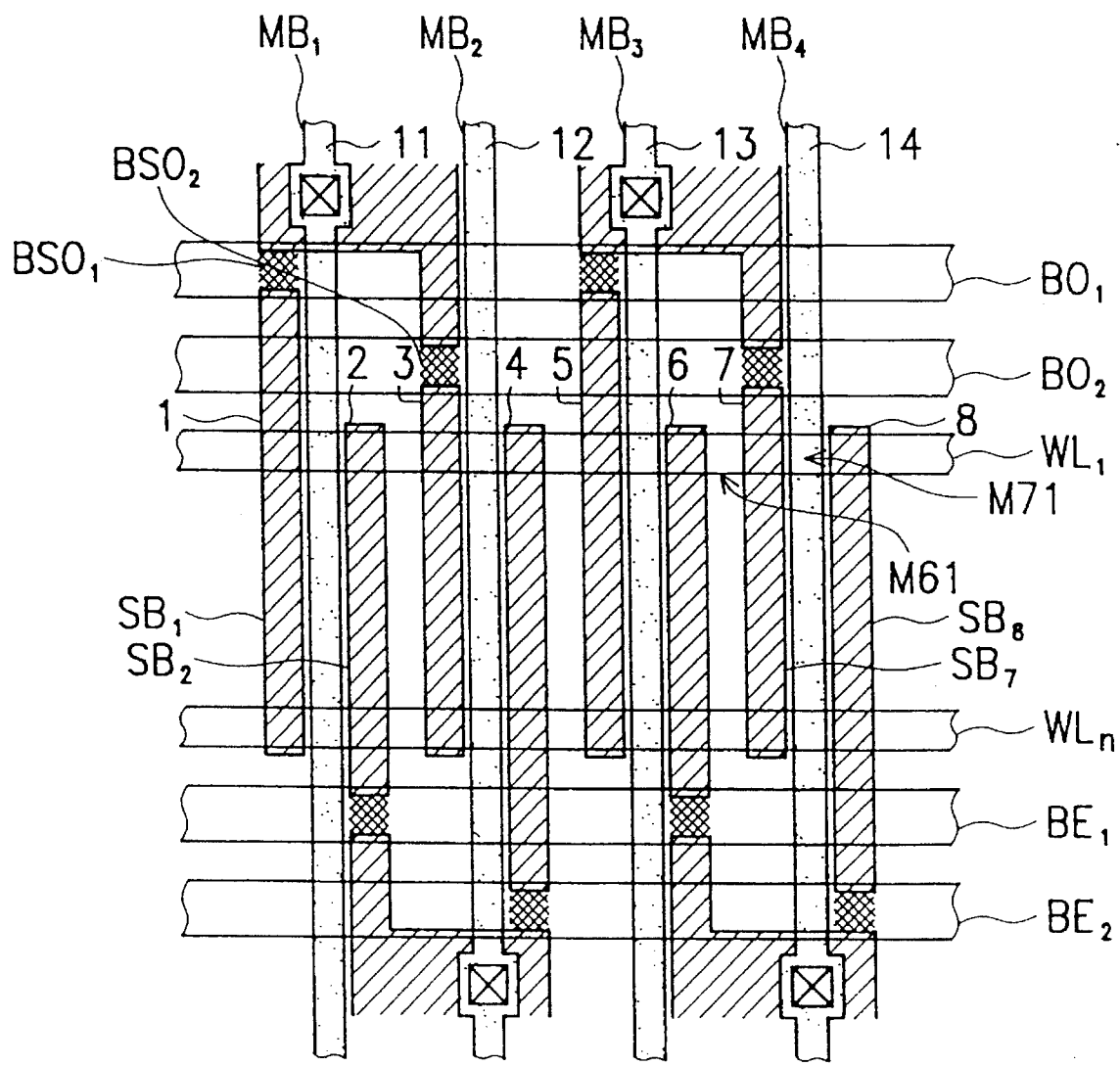
FIG. 1 (Prior Art) is a layout configuration of a prior art ROM array.
Figure 2:
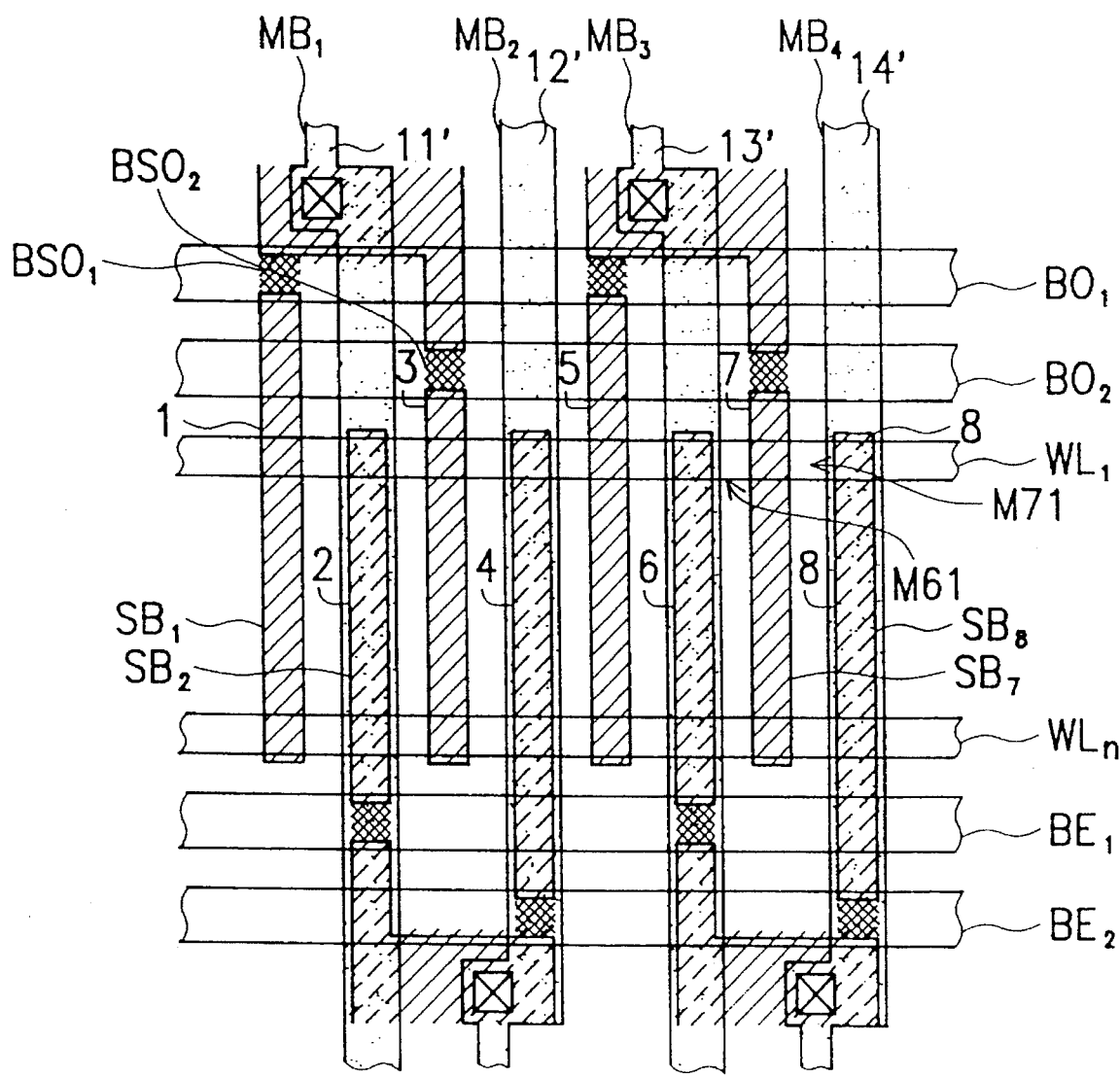
FIG. 2 (Prior Art) is a layout configuration of a prior art ROM array with coding after metallization.
Figure 3A:
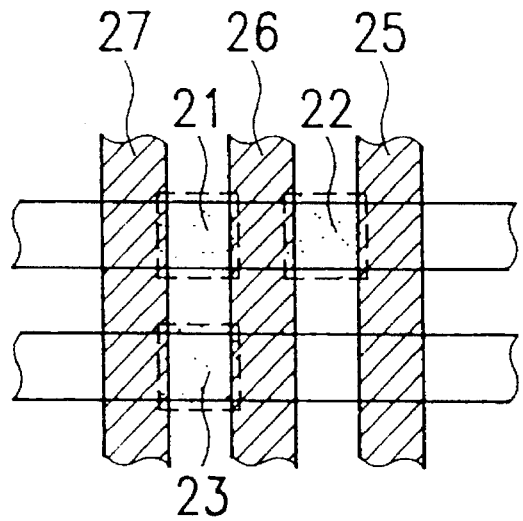
FIG. 3A is schematic diagram illustrating coding regions of a ROM array.
Figure 3B:
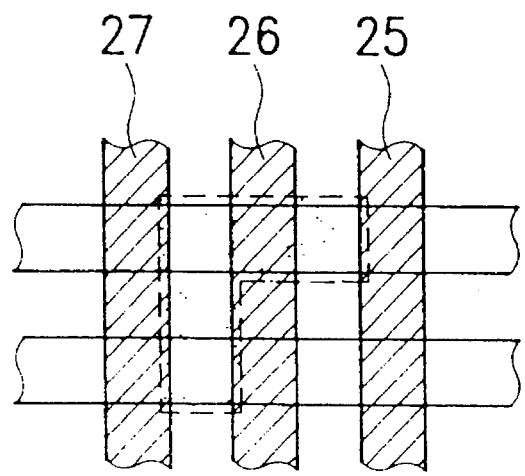
FIG. 3B is schematic diagram illustrating coding regions of a ROM array following the design rules.
Figure 4:
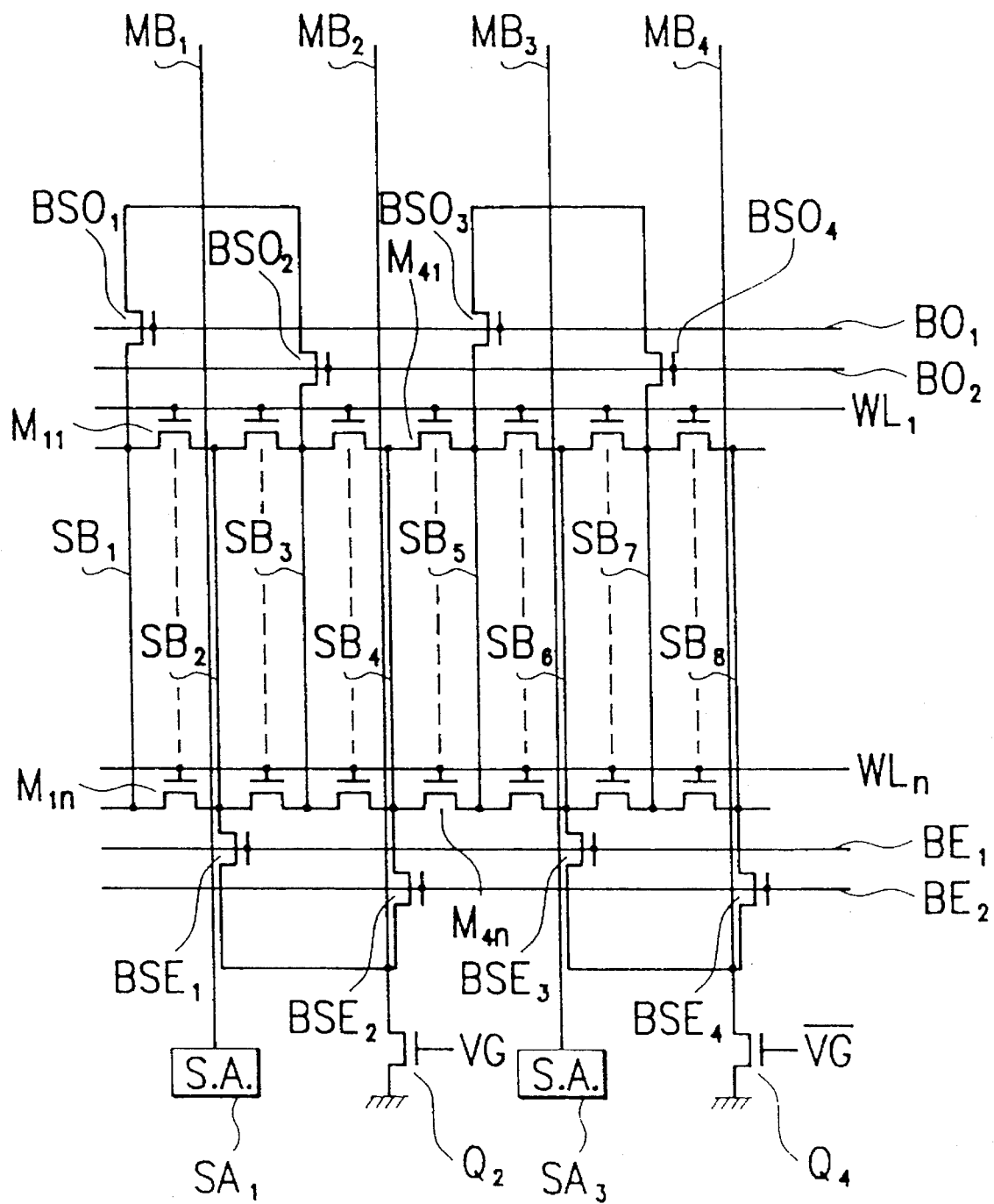
FIG. 4 (Prior Art) is a circuit diagram illustrating the corresponding circuit of FIG. 2 (Prior Art)
Figure 5A:
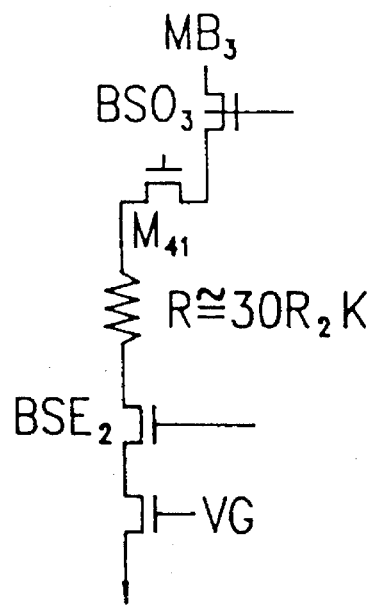
FIGS. 5A (Prior Art) and 5B are schematic diagrams illustrating data reading paths to memory cells of the ROM array of FIG. 2 (Prior Art)
Figure 5B:
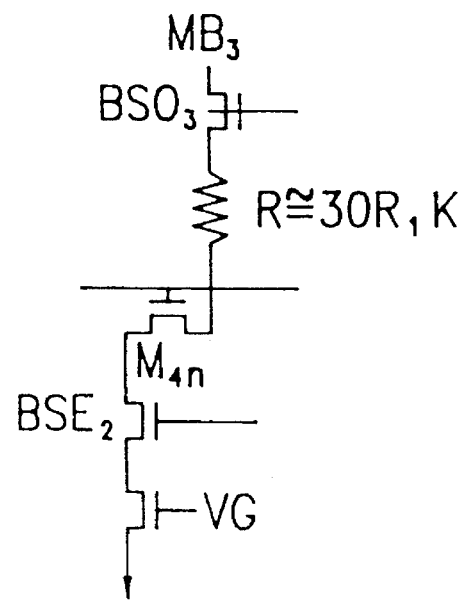
Figure 6:
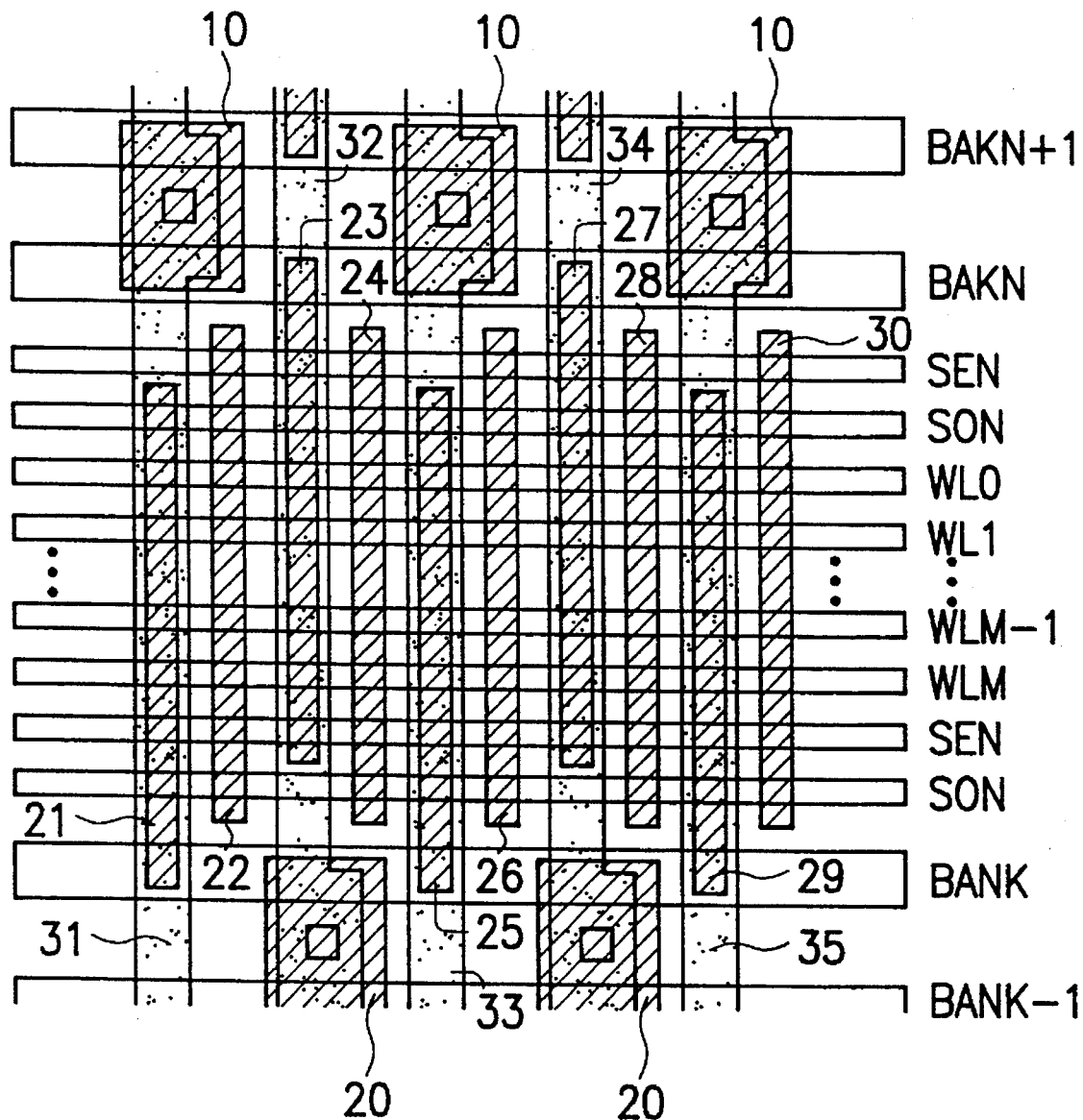
FIG. 6 is a schematic diagram illustrating a layout configuration according to a preferred embodiment of the present invention.
Figure 7:
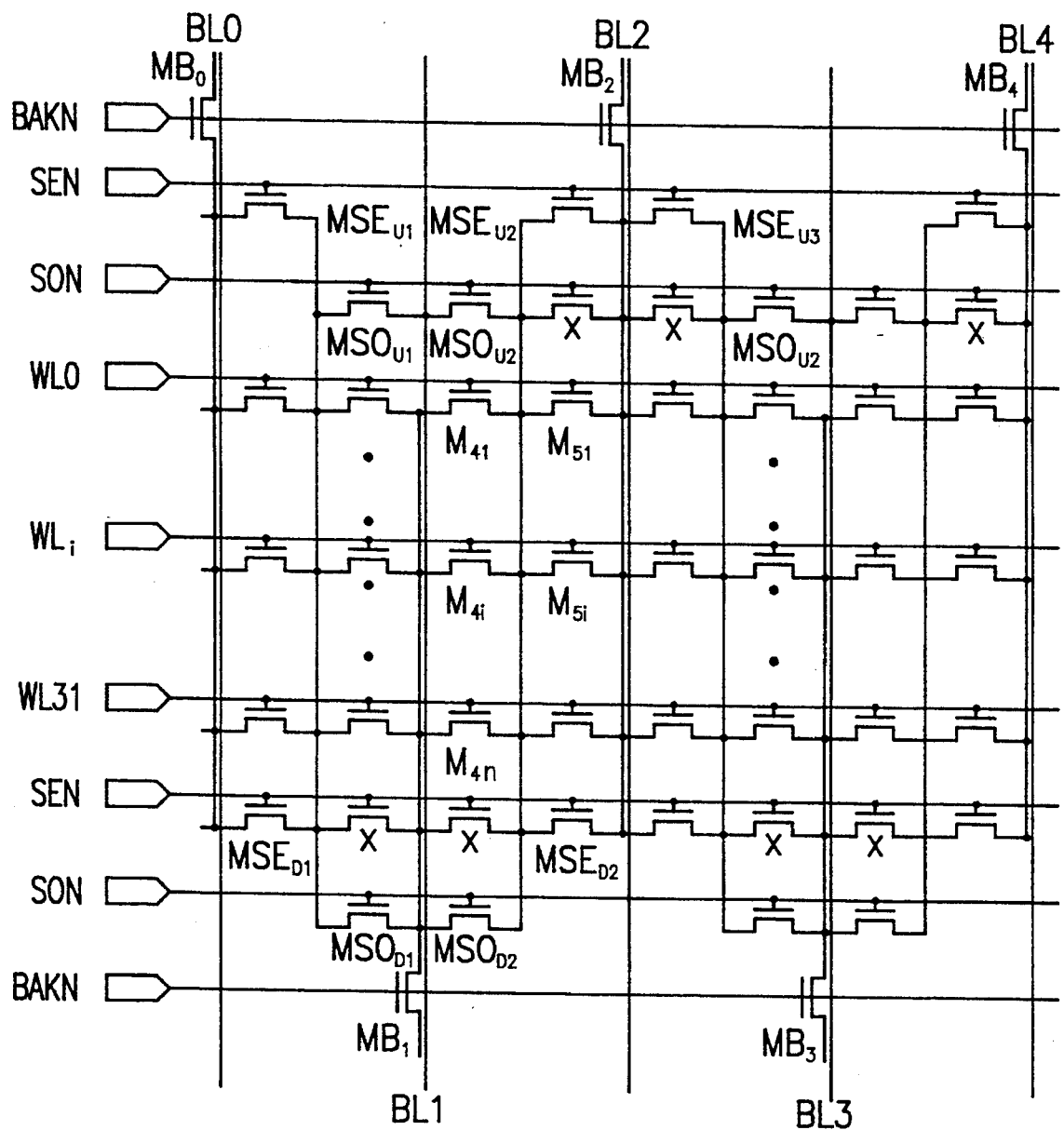
FIG. 7 is a circuit diagram illustrating the corresponding circuit of the ROM array of FIG. 6.

A ROM array layout configuration according to a preferred embodiment of the present invention is illustrated in FIG. 6, and its corresponding circuit diagram is depicted in FIG. 7. Though the structure shown in FIG. 6 and 7 is of only one bank, the ROM array may consist of a plurality of banks. The data reading operation in a specific bank is determined by a plurality of bank selecting lines, such as selecting lines BAKN+1, BAKN and BAKN−1 as shown in FIG. 6. In order to make the description clearer, the two opposing sides of the bank structures shown in FIGS. 6 and 7 are designated as a first side and a second side, wherein the first side is the side including selecting line BAKN+1 and a plurality of diffusion regions 10. The second side is the side having selecting line BAKN−1 and a plurality of diffusion regions 20. Therefore, a first direction from the first side to the second side of the ROM array and a second direction perpendicular to the first direction are also defined.

Referring to FIG. 6, the ROM array comprises a plurality of first bit lines 21, 23, 25, 27 and 29 which are diffusion regions extending in the first direction in the semiconductor substrate. The ROM array also comprises a plurality of second bit lines 22, 24, 26, 28 and 30 formed by diffusion regions. Each of the second bit lines extends in the first direction between every two neighboring first bit lines. Furthermore, a plurality of word lines WL0 through WLM extend in the second direction to intersect the first and second bit lines, thus forming a plurality of memory cells. The number of word lines, i.e., a value of m+1 is chosen to be 31 in FIG. 7 for simplicity. Each memory cell is a transistor. The word lines, made of a material such as polysilicon, are the gates of the memory cells, and the first and second bit lines form the source/drain regions. Therefore, spacings between bit lines become the channel regions of the memory cells, and the coding step is carried out to implant impurities therein.

In order to facilitate code implantation, a plurality of third bit lines 31 through 35, which are metal lines, are formed on top of the first bit lines 21, 23, 25, 27 and 29 and extend in the first direction to expose the channel regions of the memory cells. The line width of the third bit lines must not be so wide as to overlay the spacings between the first and second bit lines.

The ROM array comprises a plurality of first control lines SEN, which are polysilicon lines extending in the second direction in the semiconductor substrate on both the first and second side of the bank structure. First control lines SEN intersect all the second bit lines but only the even numbers of the first bit lines 23 and 27 on the first side to form a plurality of switches. On the second side, first control lines SEN intersect all of the first and second bit lines to form a plurality of switches. The switches, such as transistors $MSE_{U1}$, $MSE_{U2}$ and $MSE_{U3}$ on the first side and $MSE_{D1}$ and $MSE_{D2}$ on the second side, include polysilicon gates provided by first control lines SEN and drain/source regions provided by the first and second bit lines.

A plurality of second control lines SON, which can be polysilicon lines, are also provided by the ROM array on both the first and second sides. Second control lines SON extend in the second direction and intersect all of the first and second bit lines on the first side to form a plurality of switches, while on the second side, second control lines SON intersect all the second bit lines but only odd numbers of first bit lines 21, 25 and 29 to form a plurality of switches. The switches, such as transistors $MSO_{U1}$, $MSO_{U2}$ and $MSO_{U3}$ on the first side and $MSO_{D1}$ and $MSO_{D2}$ On the second side, include polysilicon gates provided by second control line SON and drain/source regions provided by the first and second bit lines.

Control lines SEN and SON are provided for controlling the switches and constitute data reading paths from the memory cells. It is noted that a number of switches are programmed to be OFF in the coding step to block undesirable current paths. The OFF switches are designated by an "x" notation near their channels as shown in FIG. 7. On the other hand, in order to obtain currents in bit lines 21–30 through third bit lines 31–35, metal contacts in diffusion regions 10 and 20 are provided. Through the metal contacts and a plurality of transistors $MB_0$–$MB_4$ controlled by bank selecting lines BAKN, the third bit lines are electrically connected to the first bit lines. Therefore, data from the memory cells can be obtained by sensing the currents in the third bit lines by controlling selecting lines BAKN, first control lines SEN and second control lines SON.

According to the present invention, the code implantation to program the memory cell is carried out after the formation of metal lines, namely third bit lines 31 through 35. Therefore, the third bit lines must be thin enough to expose the spacings between the first and second bit lines for code implantation. On the other hand, since the first bit lines are covered by the third bit lines, the code implantation has almost no influence on the resistance of the first bit lines. That is, the sheet resistance of the first bit lines is about $R_2$, as is mentioned above. While as to the second bit lines, the sheet resistance thereof may be increased to $R_1$ after the coding step. Therefore, the effective resistance of the first bit lines and the second bit lines can be designated as $R_A$ and $R_B$ respectively, wherein $R_A/R_B \cong 2/3$.

The data reading operation from some memory cells of the ROM array according to the invention will be described. Referring to FIG. 7, wherein a plurality of memory cells $M_{41}$, $M_{51}$, $M_{4i}$, $M_{5i}$ and $M_{4n}$ are depicted to represent their various reading paths. More detailed descriptions of the reading paths are depicted in FIGS. 8 through 11.

Figure 8:
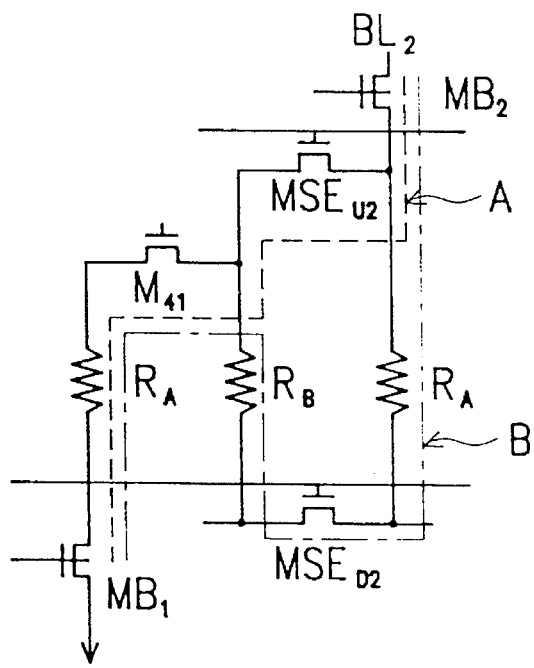
FIGS. 8 through 11 are schematic diagrams illustrating the data reading paths from the memory cells of the ROM array depicted in FIG. 6.

First, referring to FIGS. 6 through 8, when the voltage levels of selecting lines BAKN, control lines SEN and word line WL0 are high, and those of control lines SON are low, two parallel data reading paths to cell $M_{41}$ are formed. The reading paths comprise a first path A which passes through switch $MSE_{U2}$, and cell $M_{41}$, and a second path B which passes through switch $MSE_{D2}$, and cell $M_{41}$. First path A consists of a portion of first bit line 23 which has an effective resistance of $R_A$. Therefore, even though second path B consists of a portion of second bit line 24 which has a higher effective resistance of $R_B$, the total effective resistance of the reading paths to cell $M_{41}$ can be reduced to less than $R_A$ by the parallel connection of first path A and second path B.

Figure 9:
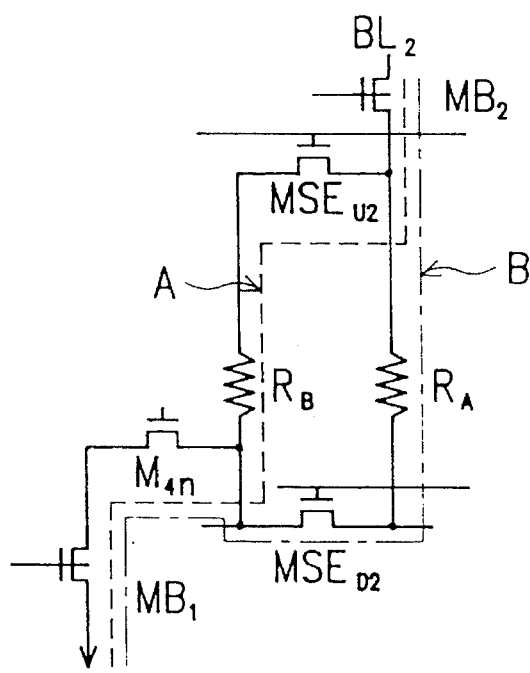

Next, when the voltage levels of selecting lines BAKN, control lines SEN and word line WL31 are high, and those of control lines SON are low, two parallel data reading paths to cell $M_n$ are formed. Referring to FIGS. 6, 7 and 9, the data reading paths comprise a first path A which consists of transistors $MB_2$, $MSE_{U2}$, $M_{4n}$ and $MB_1$ and a portion of second bit line 24, and a second path B which consists of transistors, $MB_2$, $MSE_{D2}$, $M_{4n}$ and $MB_1$ and a portion of first bit line 25. Since the effective resistance of first bit line 25, i.e., $R_A$, is lower than that of second bit line 24, i.e., $R_B$, the sensing current through path B will be greater and thus: dominate the total sensing current. Furthermore, by combining the currents of the two parallel reading paths, the total sensing current can attain a higher value that facilitates the sensing operation of the sense amplifier (not shown in the drawings).

Figure 10:
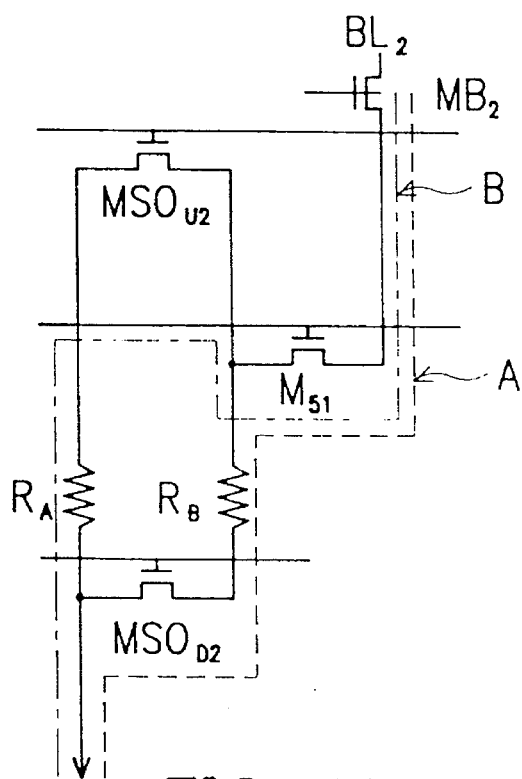

When the voltage levels of selecting lines BAKN, control lines SON and word line WL0 are high, and those of control lines SEN are low, two parallel data reading paths to cell $M_{51}$ are formed. Referring to FIGS. 6, 7 and 10, a first path A consists of transistors $MB_2$, $M_{51}$ and $MSO_{D2}$ and a portion of second bit line 24 which has an effective resistance of $R_B$. A second path B consists of transistors $MB_2$, $M_{51}$ and $MSC_{U2}$ and a portion of first bit line 23 which has an effective resistance of $R_A$. Since second path B has a lower effective resistance, $R_A$, the sensing current through path B is greater than in the first path and therefore total sensing current is dominated by second path B. The total sensing current also has a higher value due to the contribution of the two parallel data reading paths.

Figure 11:
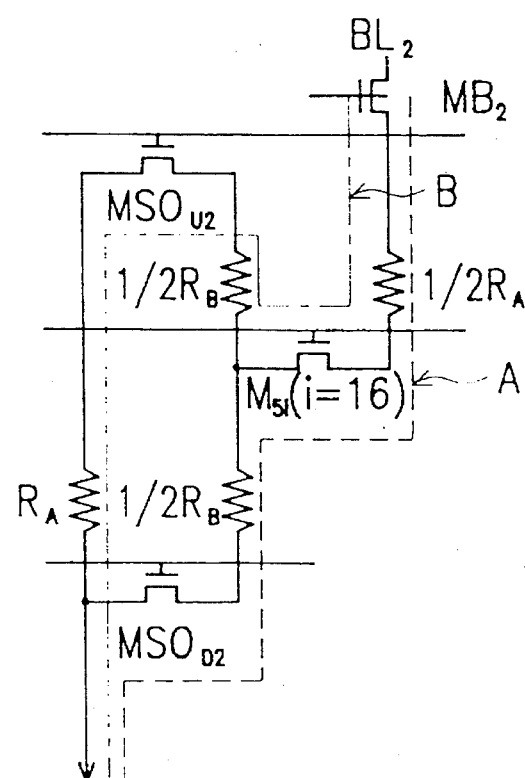

Furthermore, referring to FIGS. 6, 7 and 11, when the voltage levels of selecting lines BAKN, control lines SON and word line WLi are high, and those of control lines SEN are low, two parallel data reading paths to cell $M_{5i}$ are formed. The value of i is nominally designated as 16 to simplify the description. A first path A consisting of transistors $MB_2$, $M_{5i}$ and $MSO_{D2}$, a portion of first bit line 25 and a portion of second bit line 24 has an effective resistance of about $\frac{1}{2}(R_A+R_B)$, while a second path B consisting of transistors $MB_2$, $M_{5i}$ and $MSO_{U2}$, a portion of first bit line 25, a portion of second bit line 24 and a portion of first bit line 23 has an effective resistance of about $\frac{1}{2}(R_A+R_B)+R_A$. As mentioned above, the ratio of $R_A$ to $R_B$ is about 2/3. Thus, the effective resistance of first path A is $\frac{5}{4}R_A$, which is approximately the effective resistance of the dominant path in the previous examples, i.e., $R_A$. Moreover, a higher total current contributed by first path A and second path B can be provided for the sensing operation of the sense amplifier.

Accordingly, the ROM array of the present invention is provided with optimized data reading paths which have a dominant path of equal effective resistance, which is approximately the effective resistance of the first bit lines. Therefore, the sensing currents of the bit lines of the ROM array can be uniform. Moreover, since there are two reading paths to each memory cell, the sensing currents can be increased to facilitate the data sensing operation of the sense amplifier.

What is claimed is:

1. A bank structure of a ROM array on a semiconductor substrate, comprising:

a plurality of first bit lines, formed by diffusion regions on the semiconductor substrate, extending in a first direction which is from a first side to a second side of the bank structure;

a plurality of second bit lines, formed by diffusion regions on the semiconductor substrate, extending in the first direction between every two neighboring the first bit lines;

a plurality of third bit lines, formed by metal lines on top of the first bit lines, extending in the first direction; wherein the third bit lines are not wide enough to overlap a spacing between each neighboring first and second bit lines;

a plurality of word lines, extending in a second direction on the semiconductor substrate, intersecting the first and second bit lines to form a plurality of memory cells;

a plurality of first control lines, extending in the second direction, intersecting even numbers of the first bit lines on the first side of the bank structure to form a plurality of switches, and intersecting the first bit lines on the second side of the ROM array to form a plurality of switches; and a plurality of second control lines, extending in the second direction, intersecting the first bit lines on the first side of the bank structure to form a plurality of switches, and intersecting odd numbers of the first bit lines on the second side of the bank structure to form a plurality of switches.

2. The bank structure of claim 1, wherein the switches are transistors of which sources and drains are formed by the first and the second bit lines and gates are formed by the control lines.

3. The bank structure of claim 1, wherein the control lines consist essentially of polysilicon.

4. The bank structure of claim 1, wherein the memory cells are transistors of which sources and drains are formed by the first and the second bit lines and gates are formed by the word lines.

5. The bank structure of claim 1, wherein the word lines consist essentially of polysilicon.

6. The bank structure of claim 1, wherein the memory cells are coded by implanting ions into the spacing between the first and second bit lines after forming the third bit lines.

7. The bank structure of claim 1 further comprising a plurality of selecting lines extending in the second direction on the first and second side of the bank structure.

8. The bank structure of claim 7, wherein:

at least two data reading paths are formed to each the memory cell by the controlling of the selecting lines, the control lines and the word lines; and the sensing current is increased and made more uniform.

* * * * *